(12) United States Patent
Pham et al.

(10) Patent No.: US 7,733,182 B2
(45) Date of Patent: Jun. 8, 2010

(54) HYBRID CLASS AB SUPER FOLLOWER

(75) Inventors: Hiep The Pham, San Jose, CA (US);
Nader Sharifi, San Jose, CA (US)

(73) Assignee: Agere Systems Inc., Allentown, PA (US)

( * ) Notice: Subject to any disclaimer, the term of this patent is extended or adjusted under 35 U.S.C. 154(b) by 26 days.

(21) Appl. No.: 12/262,652

(22) Filed: Oct. 31, 2008

(65) Prior Publication Data
US 2010/0109779 A1    May 6, 2010

(51) Int. Cl.
*H03F 3/26*    (2006.01)
(52) U.S. Cl. .................. 330/267; 330/264; 330/265
(58) Field of Classification Search .......... 330/267, 330/264, 265
See application file for complete search history.

(56) References Cited

U.S. PATENT DOCUMENTS

| | | | | |
|---|---|---|---|---|
| 6,154,063 A * | 11/2000 | Fang et al. | .......... | 326/126 |
| 6,271,711 B1 * | 8/2001 | Shenoy | .......... | 327/530 |
| 6,580,324 B2 * | 6/2003 | Palaskas et al. | .......... | 330/258 |
| 6,924,674 B2 | 8/2005 | Jalaleddine et al. | | |
| 7,151,410 B2 * | 12/2006 | Franck et al. | .......... | 330/264 |
| 7,282,948 B2 * | 10/2007 | Bales | .......... | 326/30 |
| 7,332,965 B2 * | 2/2008 | Seth et al. | .......... | 330/288 |
| 7,405,624 B2 | 7/2008 | Franck et al. | | |

* cited by examiner

*Primary Examiner*—Patricia Nguyen
(74) *Attorney, Agent, or Firm*—Daniel J. Santos

(57) ABSTRACT

Various embodiments of a hybrid class AB super follower circuit are provided. One embodiment is a follower circuit comprising: an input node for receiving an input voltage signal; an output node for driving a capacitive load based on the input voltage signal; a transistor M1 having a gate terminal connected to the input node for receiving the input voltage signal, a source terminal connected to the output node, and a drain terminal; a feedback loop comprising a second transistor M2, a third transistor M3 and a fourth transistor M4, wherein: the gate and source terminals of the second transistor M2 are connected to a current source I2, and the drain terminal of the second transistor M2 is connected to the output node; the source terminal of the third transistor M3 is connected to the current source I2 and the drain terminal of the third transistor M3 is connected to a current source I0; the gate terminal of the fourth transistor M4 is connected to the drain terminal of the third transistor M3, the drain terminal of the fourth transistor M4 is connected to the output node, and the source terminal of the fourth transistor M4 is connected to a ground; and a replica bias circuit for providing a voltage bias signal to the gate terminal of the third transistor.

4 Claims, 1 Drawing Sheet

HYBRID CLASS AB SUPER FOLLOWER

BACKGROUND

The invention generally relates to follower circuits, and more particularly relates to class AB and super follower circuits.

Follower circuits are commonly used as drivers to buffer signals and provide a low output impedance to drive resistive (R) and/or capacitive (C) loads. Follower circuits typically exhibit high linearity and low distortion characteristics. However, in applications where the C or RC load is large, follower circuits have the disadvantage of consuming much power and requiring a larger area. Furthermore, to increase bandwidth, a follower circuit requires large bias current/transistor size to increase transconductance (gm) and reduce output impedance. The transconductance problem may be particularly troublesome in certain types of applications, such as, for example, in deep sub-micron complementary metal oxide semiconductor (CMOS) processes. Increasing transistor size further contributes to the problem of increased C or RC loads, which leads to even more power consumption and larger area.

Follower circuits also have the disadvantage of larger slew rates or settling times. In electronics, the slew rate represents the maximum rate of change of a signal at any point in a circuit. Limitations in slew rate capability can give rise to non linear effects. To reduce the large signal settling time, follower circuits may require larger bias current, which in turn increases power consumption and silicon area.

To address these and other problems, certain types of follower circuits have been developed. For example, class AB followers address the problem of increased slew rates by implementing a push-pull driver effect. The push-pull arrangement is provided with a complementary pair of transistors, in which each transistor amplifies opposite halves of the input signal and, thereby, charges and discharges the C or RC load. While this arrangement addresses the slew rate problem, class AB followers have significant disadvantages. Class AB followers require large headroom (e.g., higher power supply) for biasing and do not adequately address the need for low output impedance.

Another type of follower circuit is a super follower circuit. Super follower circuits address bandwidth issues by reducing output impedance with a gain path that generates high current drive (transconductance). While super follower circuits can meet bandwidth requirements (e.g., by reducing follower impedance), they do not adequately address the slew rate problem. Super follower circuits generate high current drive only on the side of the gain path, and still have to overcome the current from the other side. In other words, super follower circuits may either address the rise time or the fall time—not both.

Despite the many advantages and the commercial success of class AB followers and super followers, there remains a need in the art for follower circuits that have the combined advantages of low output impedance, high bandwidth, and push-pull capability to reduce transient settling time.

SUMMARY

Various embodiments of a hybrid class AB super follower circuit are provided. One embodiment is a follower circuit comprising: an input node for receiving an input voltage signal; an output node for driving a capacitive load based on the input voltage signal; a transistor M1 having a gate terminal connected to the input node for receiving the input voltage signal, a source terminal connected to the output node, and a drain terminal; a feedback loop comprising a second transistor M2, a third transistor M3 and a fourth transistor M4, wherein: the gate and source terminals of the second transistor M2 are connected to a current source I2, and the drain terminal of the second transistor M2 is connected to the output node; the source terminal of the third transistor M3 is connected to the current source I2 and the drain terminal of the third transistor M3 is connected to a current source I0; the gate terminal of the fourth transistor M4 is connected to the drain terminal of the third transistor M3, the drain terminal of the fourth transistor M4 is connected to the output node, and the source terminal of the fourth transistor M4 is connected to a ground; and a replica bias circuit for providing a voltage bias signal to the gate terminal of the third transistor.

DETAILED DESCRIPTION

Figure 1:
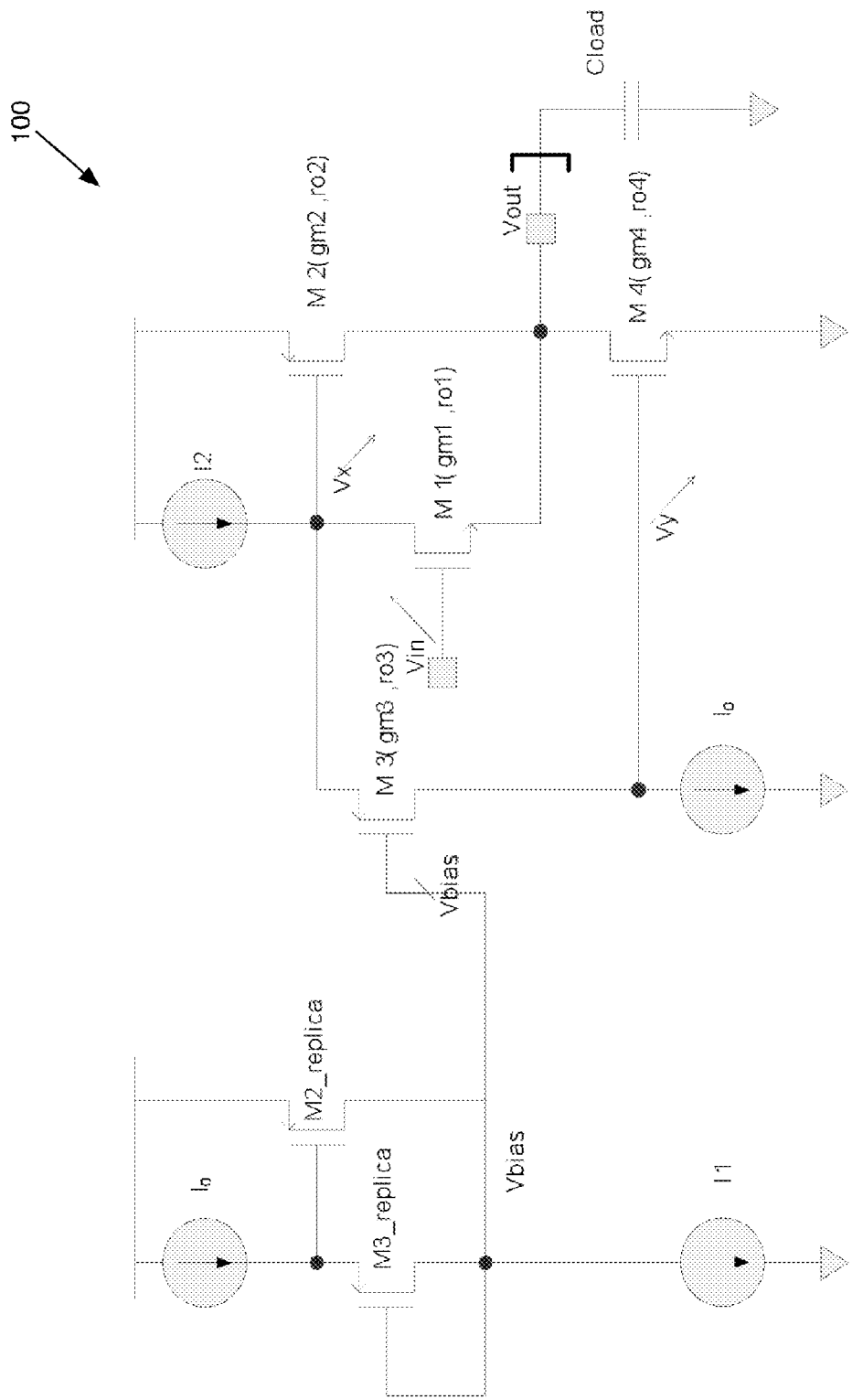
FIG. 1 is a circuit diagram illustrating an embodiment of a hybrid class AB super follower circuit.

FIG. 1 illustrates a schematic circuit diagram of an embodiment of a hybrid class AB super follower circuit 100. One of ordinary skill in the art will appreciate with reference to this disclosure that the hybrid class AB super follower circuit 100 generally comprises a circuit topology which implements certain aspects of a conventional super source follower circuit and a conventional class AB driver. Unlike existing follower circuits, the novel hybrid configuration provides a follower circuit that has the combined advantages of low output impedance, high bandwidth, and push-pull capability to reduce transient settling time.

Referring to the embodiment illustrated in FIG. 1, the hybrid class AB super follower circuit 100 has an input node for receiving an external voltage input signal ($V_{in}$) and an output node for driving, for example, a capacitive load ($C_{load}$) with an output voltage signal ($V_{out}$). The hybrid class AB super follower circuit 100 generally comprises two circuit portions: (1) a follower section; and (2) a replica bias circuit. The follower section comprises a novel composite of a super source follower and a class AB driver. As illustrated in FIG. 1, the follower section may comprise four transistors—transistors M1, M2, M3, and M4. Transistor M1 performs the main operation for driving the capacitive load, and the transistors M2, M3, and M4 define a feedback loop to the transistor M1. The gate of the transistor M1 is connected to the input node and receives the input voltage signal ($V_{in}$. The source of the transistor M1 is connected to the output node on which the output voltage signal ($V_{out}$) is provided to the capacitive load ($C_{load}$). The drain of the transistor M1 is connected to a current source I2.

The gate of the transistor M2 is connected to the current source I2 and the drain of the transistor M1. The drain of the transistor M2 is connected to the source of the transistor M1 and the output node that provides the output voltage signal $V_{out}$. The source of the transistor M2 is connected to the opposite terminal of the opposite terminal of the current source I2. The source of the transistor M3 is connected to the gate of the transistor M2. The drain of the transistor M3 is connected to a current source I0. As described below in more detail, the gate of the transistor M3 receives a voltage bias from the replica bias circuit.

The gate of the transistor M4 is connected to the drain of the transistor M3 and the current source I0. The drain of the transistor M4 is connected to the output node that provides the output voltage signal $V_{out}$. The source of the transistor M4 is connected to ground.

In operation of the follower section of the hybrid class AB super follower circuit 100, the feedback loop monitors the output of the transistor M1 and provides a push-pull effect via the transistor M2 and the transistor M4. The transistor M2 monitors the output of the transistor M1 and delivers a signal through the transistor M3 and the current source I0 and to the transistor M4. One of ordinary skill in the art will appreciate that the feedback loop defined by the transistors M2, M3 and M4 (and the current sources I2 and I0) is designed such that whatever needs to happen on $V_{out}$ in terms of the amount of the charging/discharging of the capacitive load ($C_{load}$) is enhanced by the action of M2, M3 and M4. In an embodiment, when $V_{in}$ goes up, as a result of the gain path of the hybrid super follower structure, $V_x$ goes down and generates a pull current via M2 and $V_y$ goes down, thereby reducing the pull down current via M4. This enables $V_{out}$ to follow $V_{in}$ while rising up relatively quickly. Similarly, when $V_{in}$ goes down, $V_x$ goes up and reduces the pull up current via M2, while $V_y$ goes down and increases the pull down current via M4. This makes $V_{out}$ follow $V_{in}$, falling down quickly.

In operation, the transistors M2 and M3 maintain a certain amount of bias current. The bias current is controlled by the replica circuit. As illustrated in FIG. 1, the replica circuit comprises current source I0 and a current source I1 and two replica transistors (i.e., transistor M2_replica and transistor M3_replica). The replica circuit provides a voltage bias, $V_{bias}$, to the gate of the transistor M3 in the follower section of the hybrid class AB super follower circuit 100. In general, it should be appreciated that the transistors M2_replica and M3_replica function to maintain a certain amount of current to the transistor M2 and M3, respectively, in the follower section. It should be further appreciated that alternative means may be employed to provide appropriate bias to the follower section. However, in the embodiment illustrated in FIG. 1, the replica transistors (i.e., the transistors M2_replica and M3_replica) enable a certain amount of tracking due to operational similarities between the transistors M2 and M3 and their replicas. For example, in operation, an increase in operational parameters, such as, temperature or voltages, will have similar affects on the transistors M2 and M3 and their replicas. In this manner, the devices may advantageously follow each other based on environmental conditions.

The gate and the drain of the transistor M3_replica are connected to the current source I1 and the gate of the transistor M3. The source of the transistor M3_replica is connected to the current source I0 and the gate of the transistor M2_replica. The source of the transistor M2_replica is connected to the opposite terminal of the current source I0.

As mentioned above, the voltage bias, $V_{bias}$, controls the amount of bias current to the transistors M2 and M3. In an embodiment, the bias currents may be controlled according to the following equations:

$IM3=I0$; where IM3 is the drain current of transistor M2

$IM1=I2-I0$; where IM1 is the drain current of transistor M1

$IM4=I2-I0+I1-I0=I2+I1$; where IM4 is the drain current of transistor M4

In the embodiment illustrated in FIG. 1, the transistors comprise metal oxide semiconductor field effect transistors (MOSFETs). For example, transistors M1 and M4 comprise P-channel MOSFETs, and transistors M2, M3, and their replicas (i.e., M2_replica and M3_replica) comprise N-channel MOSFETs. One of ordinary skill in the art will appreciate that the functions and advantages of the embodiment illustrated in FIG. 1 may be readily achieved using other types of transistors and processes, including bipolar junction transistors, with alternative circuit arrangements and topologies.

Referring again to the embodiment illustrated in FIG. 1, one of ordinary skill in the art will readily appreciate that the hybrid class AB super follower circuit 100 (and alternatives) may provide the combined advantages of low output impedance, high bandwidth, and push-pull capability to reduce transient settling time. The hybrid configuration incorporates the push-pull capability of conventional class AD drivers and the low output impedance and high bandwidth characteristics of conventional super follower circuits. While maintaining low bias current and good linearity, the hybrid class AB super follower may also provide higher bandwidth as a multiple of transconductance (gm) times the output impedance (ro) as compared to super follower circuits and (gm*ro)^2 compared to regular follower circuits. Furthermore, the hybrid class AB super follower circuit may provide faster settling times, for example, by a factor of approximately 1.5 compared to super follower circuits.

It should be noted that this disclosure has been presented with reference to one or more exemplary or described embodiments for the purpose of demonstrating the principles and concepts of the invention. The invention is not limited to these embodiments. As will be understood by persons skilled in the art, in view of the description provided herein, many variations may be made to the embodiments described herein and all such variations are within the scope of the invention.

What is claimed is:

1. A follower circuit comprising:
   an input node for receiving an input voltage signal;
   an output node for driving a capacitive load based on the input voltage signal;
   a transistor M1 having a gate terminal connected to the input node for receiving the input voltage signal, a source terminal connected to the output node, and a drain terminal;
   a feedback loop comprising a second transistor M2, a third transistor M3 and a fourth transistor M4, wherein:
      the gate and source terminals of the second transistor M2 are connected to a current source I2, and the drain terminal of the second transistor M2 is connected to the output node;
      the source terminal of the third transistor M3 is connected to the current source I2 and the drain terminal of the third transistor M3 is connected to a current source I0;
      the gate terminal of the fourth transistor M4 is connected to the drain terminal of the third transistor M3, the drain terminal of the fourth transistor M4 is connected to the output node, and the source terminal of the fourth transistor M4 is connected to a ground; and
   a replica bias circuit for providing a voltage bias signal to the gate terminal of the third transistor.

2. The follower circuit of claim 1, wherein the replica bias circuit comprises:
   a fifth transistor comprising a replica of the third transistor M3, wherein the gate and drain terminals of the fifth transistor are connected to a current source I1 and the gate terminal of the third transistor M3, and the source terminal of the fifth transistor is connected to the current source I0; and
   a sixth transistor comprising a replica of the second transistor M2, wherein the gate and source terminals of the sixth transistor are connected to the source terminal of the fifth transistor, and the drain terminal of the sixth transistor is connected to the gate of the third transistor M3.

3. The follower circuit of claim 2, wherein each of the transistors comprises a MOSFET.

4. A hybrid class AB super follower circuit comprising:

an input node for receiving an input voltage signal;

an output node for driving a capacitive load based on the input voltage signal;

a transistor M1 having a gate terminal connected to the input node for receiving the input voltage signal, a source terminal connected to the output node, and a drain terminal;

a second transistor M2 having gate and source terminals connected to a current source I2, and a drain terminal of the second transistor M2 connected to the output node;

a third transistor M3 having a source terminal connected to the current source I2 and a drain terminal connected to a current source I0;

a fourth transistor M4 having a gate terminal connected to the drain terminal of the third transistor M3, a drain terminal connected to the output node, and a source terminal connected to a ground;

a fifth transistor comprising a replica of the third transistor M3 and having gate and drain terminals connected to a current source I1 and the gate terminal of the third transistor M3, and a source terminal connected to the current source I0; and a sixth transistor comprising a replica of the second transistor M2 and having gate and source terminals connected to the source terminal of the fifth transistor, and a drain terminal connected to the gate of the third transistor M3.

* * * * *